United States Patent
Cheng et al.

(10) Patent No.: US 6,713,407 B1
(45) Date of Patent: Mar. 30, 2004

(54) METHOD OF FORMING A METAL NITRIDE LAYER OVER EXPOSED COPPER

(75) Inventors: Yi-Lung Cheng, Taipei (TW); Wen-Kung Cheng, Toufen (TW); Sez-An Wu, Hsin-Chu (TW); Yi-Lung Wang, Tai-chung County (TW); Shin-Chi Lin, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/284,399

(22) Filed: Oct. 29, 2002

(51) Int. Cl.$^7$ .................. H01L 21/31; H01L 21/469
(52) U.S. Cl. .................. 438/775; 438/680; 438/700
(58) Field of Search ................. 438/680, 681, 438/692, 689, 697, 700, 704, 706, 712, 733, 738, 745, 775, 905

(56) References Cited

U.S. PATENT DOCUMENTS

| | | | |
|---|---|---|---|
| 6,100,195 A | * | 8/2000 | Chan et al. ............ 438/687 |
| 6,534,395 B2 | * | 3/2003 | Werkhoven et al. ...... 438/627 |
| 6,566,250 B1 | * | 5/2003 | Tu et al. ................ 438/637 |
| 6,576,543 B2 | * | 6/2003 | Lin et al. ............... 438/622 |
| 6,579,793 B2 | * | 6/2003 | Zhuang et al. .......... 438/681 |

* cited by examiner

*Primary Examiner*—David Nhu
(74) *Attorney, Agent, or Firm*—Tung & Associates

(57) ABSTRACT

A method of depositing a plasma enhanced CVD metal nitride layer over an exposed copper surface in a semiconductor wafer manufacturing process to improve the metal nitride layer adhesion and to reduce copper hillock formation including providing a process surface which is an exposed copper surface; preheating the process surface; plasma sputtering the exposed copper surface in-situ to remove copper oxides; and, depositing a metal nitride layer in-situ according to a plasma enhanced CVD process at a selected deposition pressure to reduce plasma ion bombardment energy transfer and to suppress-copper hillock formation.

20 Claims, 1 Drawing Sheet

METHOD OF FORMING A METAL NITRIDE LAYER OVER EXPOSED COPPER

FIELD OF THE INVENTION

This invention generally relates to methods for forming copper filled semiconductor features and more particularly to a method for forming a metal nitride layer over copper filled semiconductor features to suppress the formation of copper hillocks.

BACKGROUND OF THE INVENTION

Copper metallization is increasingly being used for advanced product integrated circuit fabrication including semiconductor features from sub-micron high aspect ratio interconnect features to larger features such as bonding pads. Copper and its alloys have lower resistivity and better electromigration resistance compared to other metals such as, for example, aluminum. These characteristics are critical for achieving higher current densities with increased device speed. While several processing difficulties related to forming copper semiconductor features have been overcome, several problems remain, especially in backend-of-line (BEOL) manufacturing processes. BEOL processes have traditionally addressed the problems of surface contaminants that adversely affect adhesion of overlying layers, contact formation, and chemical mechanical polishing (CMP).

One exemplary process for forming a multiple level semiconductor device includes, for example, a dual damascene process. Although there are several different manufacturing methods for manufacturing dual damascene structures, all such methods employ at least two photolithographic masking and anisotropic etching steps, for example, first forming vias to electrically interconnect different device levels followed by the formation of an overlying trench at least partially encompassing one or more vias to provide electrical interconnection between multiple device levels and within a device level. In most devices, pluralities of vias are separated from one another along the semiconductor wafer and selectively interconnect conductive regions between levels of a multi-level device. Metal interconnect lines, also referred to as trench lines typically serve to selectively interconnect conductive regions within a level of a multi-level device. Dual damascene formation is a process whereby via openings and trench line openings are formed in one or more dielectric insulating layers to form a dual damascene structure followed by a metal deposition process to fill the dual damascene structure to form the necessary electrical connections.

In forming a copper semiconductor feature, typically a relatively pure (undoped) copper material is deposited to fill an anisotropically etched opening, for example a dual damascene structure. Copper electro-chemical plating (ECP) is a preferable method for depositing copper to achieve superior step coverage of sub-micron etched features. ECP generally includes depositing a copper seed layer over the barrier layer and then electroplating bulk copper over the seed layer to fill the etched feature to form, for example, vias and trench lines. The deposited copper layer is then planarized to remove excess copper overlying the feature level by chemical mechanical polishing (CMP).

One problem affecting BEOL processes in copper metallization is the tendency of copper to easily form oxides of copper, for example CuO or $CuO_2$ upon exposure to oxidizing environments including humid environments. Prior to forming a next level of the device, a metal nitride layer which functions as an etching stop layer in formation of metal interconnect features such as vias or dual damascenes in overlying dielectric insulating layers, is typically deposited over the exposed copper. The overlying etching stop layer also protects the copper against further oxidation.

One problem with prior art processes of forming metal nitride layers over exposed copper is the thermal stresses the copper is exposed to during the process. For example, prior art processes have typically included plasma processes to treat the exposed copper surface followed by metal nitride layer deposition. The prior art plasma processes typically include thermal cycles that result in thermal mismatch stresses building up in the copper layer which results in the formation of hillocks, or sharp copper protrusions into the overlying metal nitride layer. The formation of copper hillocks can result in the shorting of metal interconnects between successively formed layers, including, for example stacked dual damascene structures.

These and other shortcomings in copper feature manufacturing processes demonstrate a need in the semiconductor processing art to develop a method for forming multiple layer devices including copper filled features where copper oxidation is effectively removed prior to formation of overlying layers without subjecting the copper filled features to thermal stresses leading to copper hillock formation.

It is therefore an object of the invention to provide a method for forming multiple layer devices including copper filled features where copper oxidation is effectively removed prior to formation of overlying layers without subjecting the copper filled features to thermal stresses leading to copper hillock formation while overcoming other shortcomings of the prior art.

SUMMARY OF THE INVENTION

To achieve the foregoing and other objects, and in accordance with the purposes of the present invention, as embodied and broadly described herein, the present invention provides a method of depositing a plasma enhanced CVD metal nitride layer over an exposed copper surface in a semiconductor wafer manufacturing process to improve the metal nitride layer adhesion and to reduce copper hillock formation.

In a first embodiment the method includes providing a process surface comprising an exposed copper surface; pre-heating the process surface; plasma sputtering the exposed copper surface in-situ to remove copper oxides; and, depositing a metal nitride layer in-situ according to a plasma enhanced CVD process at a selected deposition pressure to reduce plasma ion bombardment energy transfer and to suppress copper hillock formation.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to a dual damascene structure including copper filled vias and trench lines it will be understood that the method of the present invention is applicable to the formation of other features having exposed copper features where a metal nitride layer is deposited overlying the exposed copper, for example copper bonding pads. Further the term 'copper' will be understood to include copper or its alloys.

In a first embodiment of the invention, a semiconductor wafer having a process surface including a copper filled feature formed in an insulating dielectric having an exposed copper surface is provided. The process surface is subjected to a low pressure treatment including a pre-heating step followed by a plasma treatment to remove copper oxides over the exposed copper surface while reducing localized heating and plasma ion surface bombardment to minimize a thermal cycle budget. A metal nitride layer is then deposited at low pressures according to a plasma enhanced CVD process at low pressures to reduce localized surface heating and to increase a compressive stress in the metal nitride layer.

In one embodiment, the exposed copper filled feature is formed by an electro-chemical plating (ECP) process. In another embodiment, the metal nitride layer is formed of silicon nitride (e.g., $Si_3N_4$) or a refractory metal nitride including titanium nitride, tantalum nitride or tungsten nitride. In a preferred embodiment, the metal nitride layer is silicon nitride.

Figure 1A:
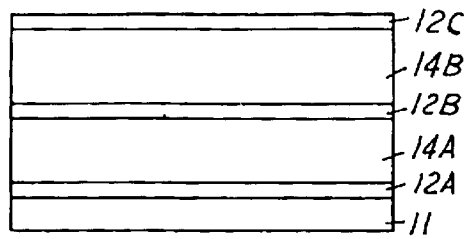
FIGS. 1A to 1F are cross-sectional side views of a portion of a multi-layer semiconductor device at stages in a manufacturing process according to an exemplary embodiment of the present invention.

For example, in an exemplary embodiment, referring to FIGS. 1A–1F, are shown cross sectional side views of a portion of a multi-level semiconductor device at stages in a dual damascene manufacturing process. Referring to FIG. 1A is shown a conductive region 11 having an overlying first etching stop layer 12A, for example, silicon nitride (e.g., SiN, $Si_3N_4$). First etching stop layer 12A is formed by a conventional chemical vapor deposition (CVD) process including for example, PECVD, having a thickness of about 300 Angstroms to about 700 Angstroms.

Still referring to FIG. 1A, formed over first etching stop layer 12A is first dielectric insulating layer 14A, also referred to as an inter-metal dielectric (IMD) layer formed of, for example, fluorinated silicate glass (FSG) or a low-k (low dielectric constant) silicon oxide based material, e.g., carbon doped silicon dioxide, preferably having a dielectric constant of less than about 3.5. Typically, the first IMD layer is formed having a thickness of about 3000 to about 7000 Angstroms.

Still referring to FIG. 1A, following deposition of the first IMD layer 14A, a second etching stop layer 12B is formed in a similar manner to first etching stop layer 12A, formed of, for example, silicon nitride (e.g., SiN, $Si_3N_4$) by a PECVD process, having a thickness of about 300 Angstroms to about 700 Angstroms. Formed over second etching stop layer 12B is a second IMD layer 14B, also formed of, for example, fluorinated silicate glass (FSG) or a low-k (low dielectric constant) silicon oxide based material, e.g., carbon doped silicon dioxide, preferably having a dielectric constant of less than about 3.5. Formed over the second IMD layer 14B is a third etching stop layer 12C, formed of silicon nitride ((e.g., SiN, $Si_3N_4$) similar to previously formed etching stop layers 12A and 12B, optionally including and overlying bottom anti-reflectance coating (BARC) layer (not shown) to reduce undesired light reflections from the second IMD layer surface during a photolithographic patterning process. Alternatively, the etching stop layer 12C may be formed of silicon oxynitride (e.g., SiON) in a conventional PECVD process to function both as an etching stop layer and BARC layer having a thickness of about 1000 to about 1400 Angstroms. It will also be appreciated that the dual damascene structure may be formed within a single IMD layer without an etching stop layer, e.g., 12B formed at a via trench line interface as shown below.

Figure 1B:
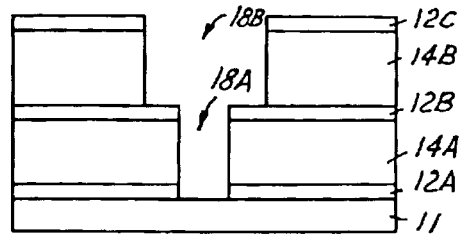

Referring now to FIG. 1B, a dual damascene structure is formed by a conventional via-first or counter-bore method where a via is first formed according to a conventional photolithographic patterning process followed by a conventional reactive ion etching (RIE) step to form via opening portion 18A initially extending through the first and second IMD layers, 14A and 14B. Still referring to FIG. 1B, a second conventional photolithographic patterning process is then carried out followed by a second conventional reactive ion etching (RIE) process to form trench portion 18B overlying and encompassing via opening portion 18A to form a dual damascene structure. It will be appreciated that the trench portion 18B of the dual damascene structure may be formed to overly and encompass more than one via opening.

Figure 1C:
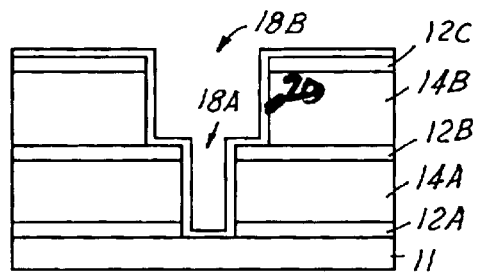

Referring to FIG. 1C, following formation of the dual damascene structure (opening), a barrier layer 20, including at least one layer of a refractory metal and refractory metal nitride, for example titanium (Ti), titanium nitride (e.g., TiN) tantalum (Ta) and tantalum nitride (e.g., TaN), for example a bi-layer of Ta/TaN, is blanket deposited by a conventional CVD process, for example an LPCVD or PECVD process to line the dual damascene structure. A copper seed layer (not shown) is then deposited by a PVD or CVD process to form a substantially conformal continuous copper layer over the process surface forming an electroplating surface.

Figure 1D:
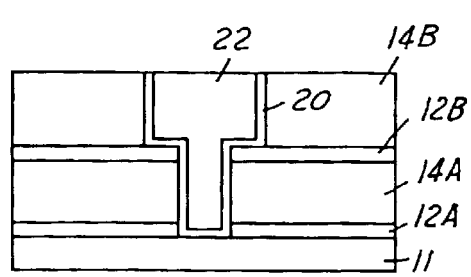

Referring now to FIG. 1D, a conventional ECP process is then carried out to fill the dual damascene structure (feature) with copper layer 22 including a portion overlying the feature level above the barrier layer 20. The overlying portion of the copper layer is then planarized according to a conventional chemical mechanical polishing (CMP) processes to first remove the excess copper overlying the barrier layer 20, followed by removal of the barrier layer and another step to remove the BARC layer and remove at least a portion of the silicon nitride etching stop layer 12C, for example, exposing the second IMD layer 14B and expose a copper portion of copper layer 22 filling the dual damascene structure.

Figure 1E:
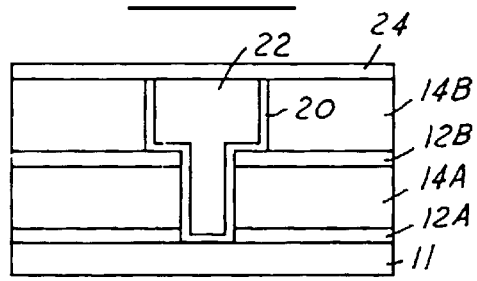

Referring to FIG. 1E, according to an embodiment of the present invention, the process wafer is then disposed in a PECVD reactor, preferably a dual frequency source plasma reactor, also referred to as a dual plasma source (DPS) reactor to deposit a metal nitride layer 24, preferably silicon nitride, overlying the exposed copper layer. The dual frequency plasma source reactor is preferred to allow separate control of an RF bias applied to the process wafer. For example the RF bias may be varied depending on the particular plasma process, including having zero power applied in order to reduce the energy of bombarding ions at the process wafer surface.

According to the present invention it has been found by experimentation that prior art plasma treatment processes and metal nitride deposition of, for example silicon nitride layer 24 over an exposed copper filled feature can result in the formation of hillocks or copper protrusions into the silicon nitride layer 24 formed overlying the copper filled feature as well as a leaving a residual copper oxide layer between the silicon nitride layer 24 and exposed surface of copper layer 22. It has been found that a thermal cycle budget of a plasma process, defined as the wafer temperature integrated over processing time, is an important factor leading to the formation of copper hillocks. For example, the formation of copper hillocks is believed to depend in a complex way on both thermal mismatch stresses produced in the copper filled feature as well as locally enhanced diffusion of the copper. In addition, it has been found that silicon nitride films formed by PECVD process at pressures greater than about 4.2 Torr over the exposed copper features form silicon nitride layers with a relatively low compressive stress believed to be due to excessive plasma ion bombardment of the silicon nitride layer as it is being formed. For example, it is believed that lower compressive stresses, for example about 0.5 dyne/cm$^2$ contribute to the formation of copper hillocks or copper protrusions into a metal nitride, for example, silicon nitride layer formed overlying the exposed copper feature.

It has also been found by experimentation and testing that the pressure of a plasma enhanced CVD deposition process of a metal nitride layer, for example silicon nitride (e.g., SiN, $Si_3N_4$,), is important in avoiding or reducing the formation of copper hillocks. For example, there has been identified an optimal pressure range for carrying out plasma sputter cleaning processes of exposed copper surfaces followed by in-situ plasma enhanced deposition of silicon nitride films overlying exposed copper features to significantly reduce the formation of copper hillocks. It is believed that lower pressures, for example from about 2.5 Torr to about 4.2 Torr, more preferably about 2.5 Torr to about 3.25 Torr, advantageously increases a mean free path of ions in the plasma to reduce plasma ion bombardment energy transfer to the process surface which in turn advantageously decreases localized heating at the process surface. In addition, in a silicon nitride PECVD process, the reduced plasma energy transfer produces silicon nitride films with a higher level of compressive stress, for example greater than about 0.5 dyne/cm$^2$ or in a range of from about 0.5 dynes/cm$^2$ to about 1.0 dynes/cm$^2$. Although the precise reason is not fully understood, it is believed that carrying out plasma processes over the preferred pressure range produces a longer mean free path of the plasma ions producing a lower degree of ion collision thereby decreasing an average energy of the plasma. As a result, localized heating of the process wafer surface is reduced, thereby reducing localized thermally induced stresses. In addition, it is believed lower pressures reduce localized charge transfer from the plasma to the process surface which may lead to copper electromigration effects which can also contribute to the formation of copper hillocks. In addition, carrying out PECVD metal nitride depositions, for example silicon nitride depositions over the preferred pressure ranges produces a silicon nitride film with a higher compressive stress. As a result, it is believed that copper hillock formation penetrating a portion of the overlying silicon nitride layer is suppressed. Regardless of the precise reason for the suppression of copper hillock formation, it has been found that formation of copper hillocks according to preferred embodiments, including a plasma pressure and thermal cycle budget, is significantly reduced.

In an exemplary implementation of the present invention, the process wafer is disposed on a wafer holding platen within a PECVD reactor including a means for controlling a wafer temperature. For example, resistive heating elements or recirculated coolant supplied in the wafer holding platen may be advantageously used for heat transfer between the wafer holding platen the process wafer to maintain a wafer temperature. In a first step according to an exemplary embodiment, the process wafer including exposed copper surfaces is pre-heated to a temperature of about 200° C. to about 350° C., more preferably about 200° C. to about 300° C. In a second step, NH$_3$ gas is supplied to the plasma reactor including one or more diluent gases for carrying out a sputter plasma treatment to remove copper oxides (e.g., CuO, Cu$_2$O) from the surface of the exposed copper. Preferably the wafer temperature is maintained at a temperature of between about 200° C. to about 350° C., more preferably between about 200° C. to about 300° C. to reduce a thermal cycle budget. Preferably, the overall pressure of the sputter plasma treatment is from about 2.5 Torr to about 4.2 Torr, more preferably about 2.5 Torr to about 3.25 Torr. Exemplary operating conditions include an RF power source of about 120 Watts to about 250 Watts with no RF bias power applied to the process wafer. The sputter clean process is preferably carried out for a period of about 15 seconds to about 30 seconds. The sputter clean process may be carried out with nitrogen as the diluent gas or another inert gas such as argon or helium. It will be appreciated that the diluent gas participates in ion bombardment of the process wafer surface. More preferably, helium or argon is used as the diluent gas as it has been observed that the suppression of copper hillock formation is improved.

Following the sputter plasma cleaning process, the plasma may be continuously maintained or may be stopped and restarted with a supply of silane (SiH$_4$) gas and ammonia (NH$_3$) supplied to the plasma reactor in conventional volumetric ratios to form a silicon nitride layer overlying the sputter cleaned copper surface. Preferably the overall deposition pressure is kept between about 2.5 Torr and about 4.2 Torr, more preferably about 2.0 Torr to about 3.25 Torr. Another advantage of operating at lower pressure is that the directionality of the impacting is increased thus resulting in a higher sticking coefficient and faster film growth. As a result the overall thermal budget cycle of the process is reduced and minimized, reducing the formation of copper hillocks. For example, preferably an average wafer temperature is maintained between about 200° C. to about 350° C. during the silicon nitride deposition process. By the term 'average wafer temperature' is meant an average temperature over time. It will be appreciated that the average wafer temperature does not specifically reflect localized heating values or temperature spikes that may occur at the surface. It will also be appreciated that localized heating values contribute to increases in average wafer temperatures. It is believed that localized heating values due to localized plasma ion surface bombardment contribute to copper hillock formation by increasing localized thermal stresses and enhancing copper diffusion. It will be appreciated that a wafer temperature is to be distinguished from a reactor chamber temperature, the chamber temperature frequently being different compared to a process wafer temperature due to differing rates of plasma ion bombardment and heat transfer. For example, in a preferred embodiment, the silicon nitride PECVD deposition process is carried for a period of about 30 seconds to about 60 seconds under plasma conditions to produce a silicon nitride layer e.g., 24 having a thickness of about 200 to about 700 Angstroms.

Figure 1F:
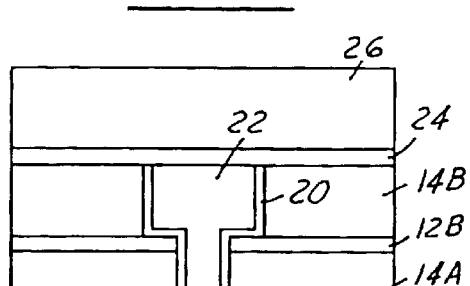

Referring to FIG. 1F, following formation of the silicon nitride layer an overlying material layer 26, for example, a dielectric insulating layer similar to IMD layers 14A and 14B is deposited overlying the silicon nitride layer to begin the process of forming an overlying semiconductor device level.

Thus, according to preferred embodiments of the present invention a method for removing copper oxides over an exposed copper surface followed by an in-situ metal nitride PECVD deposition process has been presented that reduces a thermal cycle budget and reduces the formation of copper hillocks penetrating an overlying metal nitride layer, preferably silicon nitride. Advantageously, it has additionally been determined that adhesion of the metal nitride layer to the exposed copper surfaces is improved.

Figure 2:
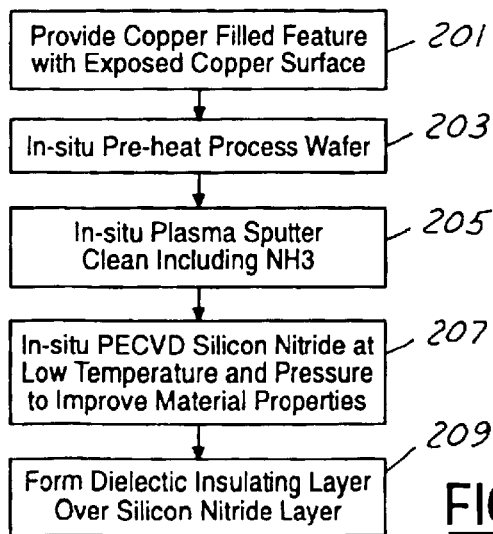
FIG. 2 is a process flow diagram according including several embodiments of the present invention.

Referring to FIG. 2 is a process flow diagram including several embodiments of the present invention. In process 201, a semiconductor process wafer including a copper filled feature having an exposed copper surface is provided. In process 203 the process wafer is disposed in a plasma reactor and subjected to an in-situ pre-heating step according to preferred wafer temperatures and reactor pressures. In process 205, an in-situ plasma sputter clean process is performed including ammonia ($NH_3$) gas at preferred reactor pressures and wafer temperatures to remove copper oxide under a reduced thermal cycle budget. In process 207, an in-situ PECVD deposition process is carried out to deposit a metal nitride layer, preferably silicon nitride, at preferred wafer temperatures and reactor pressures under a reduced thermal cycle budget to produce a metal nitride film having reduced copper hillock formation. In process 209, a dielectric insulating layer is deposited over the metal nitride film.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of depositing a plasma enhanced CVD metal nitride layer over an exposed copper surface in a semiconductor wafer manufacturing process to improve the metal nitride layer adhesion and to reduce copper hillock formation comprising the steps of:

providing a process surface comprising an exposed copper surface;

pre-heating the process surface;

plasma sputtering the exposed copper surface in-situ to remove copper oxides; and, depositing a metal nitride layer in-situ according to a plasma enhanced CVD process at a selected deposition pressure to reduce plasma ion bombardment energy transfer and to suppress copper hillock formation.

2. The method of claim 1, wherein the step of pre-heating the process surface comprises heating the process surface to a temperature of between about 200° C. and 350° C. at a pressure of between about 2.5 Torr and about 4.2 Torr.

3. The method of claim 2, wherein the step of plasma sputtering the exposed copper surface in-situ comprises ammonia ($NH_3$) gas as a plasma source gas.

4. The method of claim 3, wherein the process surface temperature is maintained between about 200° C. and 350° C. at a pressure of between about 2.5 Torr and about 4.2 Torr for a period of time from about 15 seconds to about 30 seconds.

5. The method of claim 4, wherein the wherein the process surface temperature is maintained at a process surface temperature no greater than a subsequent metal nitride layer deposition temperature.

6. The method of claim 1, wherein the metal nitride layer includes at least one layer selected from the group consisting of a refractory metal and a refractory metal nitride.

7. The method of claim 1, wherein the metal nitride layer is silicon nitride produced by CVD precursors comprising silane ($SiH_4$) and ammonia ($NH_3$).

8. The method of claim 7, wherein the step of depositing a metal nitride layer in-situ comprises a process surface temperature maintained between about 200° C. and 350° C. and a pressure of between about 2.5 Torr and about 4.2 Torr for a period of from about 15 seconds to about 60 seconds.

9. The method of claim 8, wherein the pressure is maintained between about 2.5 Torr and about 3.25 Torr.

10. The method of claim 8, wherein the metal nitride layer is formed to have a compressive stress.

11. The method of claim 1, wherein the exposed copper surface is formed by an ECP process.

12. A method of in-situ plasma sputtering and plasma enhanced CVD silicon nitride layer deposition over an exposed copper surface to reduce a thermal cycle budget and suppress copper hillock formation comprising the steps of:

providing a semiconductor wafer having a process surface comprising an exposed copper surface;

arranging the semiconductor wafer in thermal heat transfer relationship to maintain a pre-selected process surface temperature range;

pre-heating the process surface to a temperature within the pre-selected process surface temperature range;

plasma sputtering the exposed copper surface in-situ with an ammonia ($NH_3$) containing plasma source gas to remove copper oxides; and, depositing a silicon nitride layer in-situ according to a plasma enhanced CVD process at a pressure of about 2.5 Torr to about 4.2 Torr to minimize localized surface heating thereby suppressing copper hillock formation.

13. The method of claim 12, wherein a pressure of 2.5 Torr to about 4.2 Torr is maintained during the steps of pre-heating and plasma sputtering to suppress copper hillock formation.

14. The method of claim 13, wherein a pressure of about 2.5 Torr to about 3.25 Torr is maintained during the steps of pre-heating and plasma sputtering.

15. The method of claim 12, wherein the pre-selected process surface temperature range is from about 200° C. to about 350° C.

16. The method of claim 15, wherein the pre-selected process surface temperature range is from about 200° C. to about 300° C.

17. A method of in-situ plasma sputtering and plasma enhanced CVD silicon nitride layer deposition over copper filled semiconductor features to reduce a thermal cycle budget and suppress copper hillock formation comprising the steps of:

providing a semiconductor wafer having a process surface comprising copper filled features having an exposed copper surface;

arranging the semiconductor wafer in thermal heat transfer relationship to maintain a pre-selected process surface temperature range;

pre-heating the process surface to a temperature not greater than about 350° C. and a pressure not greater than about 4.2 Torr;

plasma sputtering the exposed copper surface in-situ with an ammonia ($NH_3$) containing plasma source gas to remove copper oxides at a pressure not greater than about 4.2 Torr; and, depositing a silicon nitride layer in-situ according to a plasma enhanced CVD process at a pressure of not greater than about 4.2 Torr to reduce a thermal cycle budget to suppress copper hillock formation.

18. The method of claim 17, wherein the steps of plasma sputtering and depositing maintain an average semiconductor wafer temperature of between about 200° C. and about 350° C.

19. The method of claim 17, wherein the steps of pre-heating, plasma sputtering, and depositing are performed over a pressure range of about 2.5 Torr to about 4.2 Torr.

20. The method of claim 17, wherein the silicon nitride layer is formed to have a compressive stress of about 0.5 $dynes/cm^2$ to about 1.0 $dynes/cm^2$.

* * * * *